(12) United States Patent
Lee et al.

(10) Patent No.: US 11,532,689 B2
(45) Date of Patent: Dec. 20, 2022

(54) ORGANIC LIGHT EMITTING DIODE DISPLAY DEVICE AND METHOD OF MANUFACTURING THE SAME

(71) Applicant: Samsung Display Co., LTD., Yongin-si (KR)

(72) Inventors: Jung Kyu Lee, Incheon (KR); Won-Seok Kim, Seoul (KR); Jong Deok Park, Seoul (KR); Ho Yun Byun, Osan-si (KR); Jung Hoon Shin, Seongnam-si (KR); Aely Oh, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 135 days.

(21) Appl. No.: 17/024,617

(22) Filed: Sep. 17, 2020

(65) Prior Publication Data
US 2021/0175315 A1 Jun. 10, 2021

(30) Foreign Application Priority Data
Dec. 10, 2019 (KR) .................. 10-2019-0163670

(51) Int. Cl.
*H01L 27/32* (2006.01)
*H01L 51/52* (2006.01)
(Continued)

(52) U.S. Cl.
CPC .......... *H01L 27/3276* (2013.01); *H01L 24/05* (2013.01); *H01L 51/0096* (2013.01); *H01L 51/5246* (2013.01); *H01L 51/56* (2013.01); *H01L 2224/05558* (2013.01); *H01L 2224/05562* (2013.01); *H01L 2227/323* (2013.01)

(58) Field of Classification Search
CPC . H01L 27/3276; H01L 24/05; H01L 51/0096; H01L 51/5246; H01L 51/56; H01L 2224/05558; H01L 2224/05562; H01L 2227/323; H01L 27/3279;
(Continued)

(56) References Cited

U.S. PATENT DOCUMENTS

| 10,180,607 B2 | 1/2019 | Kong et al. |
| 10,319,802 B1 | 6/2019 | Choi et al. |

(Continued)

FOREIGN PATENT DOCUMENTS

| KR | 10-2015-0047711 | 5/2015 |
| KR | 10-2017-0034078 | 3/2017 |

(Continued)

*Primary Examiner* — Mamadou L Diallo
(74) *Attorney, Agent, or Firm* — H.C. Park & Associates, PLC

(57) ABSTRACT

A display device includes a first substrate having a display area and a peripheral area, the first substrate including a first inclined surface disposed at an outer portion of the peripheral area and being angled relative to the first substrate in the display area; a pixel structure disposed on the first substrate in the display area; a second substrate disposed on the pixel structure; a first electrode disposed on the first inclined surface and between the first substrate and the second substrate; and a second electrode disposed on sides of the first and second substrates, the second electrode being in contact with the first electrode.

20 Claims, 11 Drawing Sheets

(51) Int. Cl.
*H01L 23/00* (2006.01)
*H01L 51/56* (2006.01)
*H01L 51/00* (2006.01)

(58) Field of Classification Search
CPC ............. H01L 27/3246; H01L 27/3248; H01L 27/3262; H01L 51/5203; Y02P 70/50; Y02E 10/549
See application file for complete search history.

(56) References Cited

U.S. PATENT DOCUMENTS

| | | |
|---|---|---|
| 10,578,933 B2 | 3/2020 | Ye et al. |
| 10,725,353 B2* | 7/2020 | Jeon .................. G02F 1/133305 |
| 2017/0357121 A1 | 12/2017 | Cho et al. |
| 2019/0196632 A1 | 6/2019 | Ryu et al. |
| 2019/0363281 A1* | 11/2019 | Kishimoto .......... H01L 51/5237 |
| 2020/0144356 A1* | 5/2020 | Shin .................... H01L 51/5246 |
| 2020/0209926 A1* | 7/2020 | Jeong .................. G06F 1/1637 |
| 2021/0141260 A1* | 5/2021 | Ye ..................... G02F 1/134309 |

FOREIGN PATENT DOCUMENTS

| | | |
|---|---|---|
| KR | 10-2017-0080937 | 7/2017 |
| KR | 10-2017-0139217 | 12/2017 |
| KR | 10-2019-0018118 | 2/2019 |
| KR | 10-2019-0076091 | 7/2019 |

* cited by examiner

ORGANIC LIGHT EMITTING DIODE DISPLAY DEVICE AND METHOD OF MANUFACTURING THE SAME

CROSS REFERENCE TO RELATED APPLICATION

This application claims priority from and the benefit of Korean Patent Application No. 10-2019-0163670 filed on, Dec. 10, 2019 which is hereby incorporated by reference for all purposes as if fully set forth herein.

BACKGROUND

Field

Exemplary implementations of the invention relate generally to an organic light emitting diode display device and a method of manufacturing the organic light emitting diode display device and, more specifically, to an organic light emitting diode display device with a side electrode and a method of manufacturing the organic light emitting diode display device with the side electrode.

Discussion of the Background

Flat panel display devices are used as display devices for replacing a cathode ray tube display device due to their lightweight and thin characteristics. As representative examples of such flat panel display devices, there are liquid crystal and an organic light emitting diode display devices.

An organic light emitting diode display device may include an upper substrate and a lower substrate, and a plurality of pad electrodes connected to an external device may be disposed on the lower substrate. The external device may generate a plurality of signals, and the signals may be provided to the organic light emitting diode display device through the pad electrodes. The length of the lower substrate may be longer than the length of the upper substrate such that the pad electrodes are in direct contact with the external device. In other words, the lower substrate may protrude in one direction more than the upper substrate, and the pad electrodes may be disposed on a protruding portion (for example, a pad area) of the lower substrate. More specifically, due to the pad area of the lower substrate, the organic light emitting diode display device may have a relatively large number of non-light emitting areas (for example, dead spaces). Organic light emitting diode display devices have been developed such that the dead space of the organic light emitting diode display device is reduced, in which only a side surface of each of the pad electrodes is exposed to the outside by removing the protruding portion of the lower substrate. However, as only the side surface of each of the pad electrodes is exposed to the outside, the exposed area of each of the pad electrodes is relatively reduced, and thus the resistances of the pad electrodes are increased.

The above information disclosed in this Background section is only for understanding of the background of the inventive concepts, and, therefore, it may contain information that does not constitute prior art.

SUMMARY

Applicant discovered that a display device having a pad electrode and a side electrode has a relatively high contact resistance between the side electrode and the pad electrode because the exposed area of the pad electrode is small.

Display devices constructed according to the principles and exemplary implementations of the invention provide low contact resistance between a side electrode and a pad electrode. For example, providing the pad electrode with an inclined portion having a larger contact area for coupling the side electrode and the pad electrode reduces the contact resistance.

In addition, display devices constructed and methods according to the principles and exemplary implementations of the invention provide improved adhesion characteristics between a flexible circuit board and a side electrode of the display devices. For example, the side electrode may be formed along a profile or an inner surface of a space defined by an inclined portion of a pad electrode of the display devices to increase the contact area and thereby improve adhesion.

In methods of manufacturing display devices according to the principles and exemplary implementations of the invention, a groove is formed on the lower substrate by using a laser, and the lower substrate positioned in the dummy area is removed, so that the inclined surface may be easily formed on the lower substrate.

Additional features of the inventive concepts will be set forth in the description which follows, and in part will be apparent from the description, or may be learned by practice of the inventive concepts.

According to one aspect of the invention, a display device includes a first substrate having a display area and a peripheral area, the first substrate including a first inclined surface disposed at an outer portion of the peripheral area and being angled relative to the first substrate in the display area; a pixel structure disposed on the first substrate in the display area; a second substrate disposed on the pixel structure; a first electrode disposed on the first inclined surface and between the first substrate and the second substrate; and a second electrode disposed on sides of the first and second substrates, the second electrode being in contact with the first electrode.

The second electrode may overlap the first inclined surface of the first substrate.

The first substrate and the second substrate may include lower and upper substrates, respectively, and have substantially the same size, and the sides of the lower and upper substrates are substantially aligned.

The first electrode may include a pad electrode extending from the first inclined surface of the first substrate in a direction from the peripheral area to the display area, and may be electrically connected to the pixel structure.

The display device may include a sealing member disposed in the peripheral area between the first substrate and the second substrate.

The sealing member may cover a part of the first electrode.

The sealing member may not overlap the first inclined surface of the first substrate.

The second electrode may include a side electrode and the sealing member and the side electrode are in contact with each other.

The first electrode may include a pad electrode, and the second electrode comprises a side electrode disposed in a space in the peripheral area defined by the second substrate, the sealing member, and the pad electrode.

The second substrate may include a second inclined surface being angled relative to the second substrate in the display area and opposed to the first inclined surface.

The display device may be an organic light emitting diode display device, the first inclined surface may be inclined in one of an upward or downward direction, the second inclined surface may be inclined in the other of the upward or downward direction, and the second electrode may overlap the second inclined surface.

According to another aspect of the invention, a method of manufacturing a display device includes the steps of: providing a first substrate having a display area, a peripheral area, and a dummy area; forming a groove in a first portion of the first substrate overlapping the peripheral area and the dummy area; forming a first electrode on the first substrate to overlap the groove in the peripheral area; forming a pixel structure on the first substrate in the display area; forming an inclined surface of the first substrate in the peripheral area by removing the first substrate in the dummy area; and forming a second electrode in contact with the first electrode.

The method may include the steps of: forming a sealing member on the first substrate in the peripheral area; forming a second substrate on the pixel structure and the sealing member; and coupling the first substrate to the second substrate through the sealing member.

The first electrode may include a pad electrode, and the second electrode comprises a side electrode being in contact with the second substrate, the first substrate, the pad electrode, and the sealing member.

The first electrode may extend from the inclined surface of the first substrate in a direction from the peripheral area to the display area, and the sealing member may cover at least a part of the first electrode.

After the first substrate in the dummy area is removed, the first substrate and the second substrate may have substantially the same size, and sides of the second substrate and the first substrate are substantially aligned.

The second electrode may be formed in a space in the peripheral area defined by the second substrate, the sealing member, and the first electrode.

The sealing member may not overlap the inclined surface of the first substrate.

The display device may be an organic light emitting diode display device, and the method may include the steps of: forming a semiconductor element in the display area between the first substrate and the pixel structure, wherein the step of forming of the semiconductor element may include: forming an active layer on the first substrate; forming a gate insulating layer on the active layer; forming a gate electrode on the gate insulating layer; forming an insulating interlayer on the gate electrode; and forming source and drain electrodes on the insulating interlayer.

The first electrode and the source and drain electrodes may be simultaneously formed from the same material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
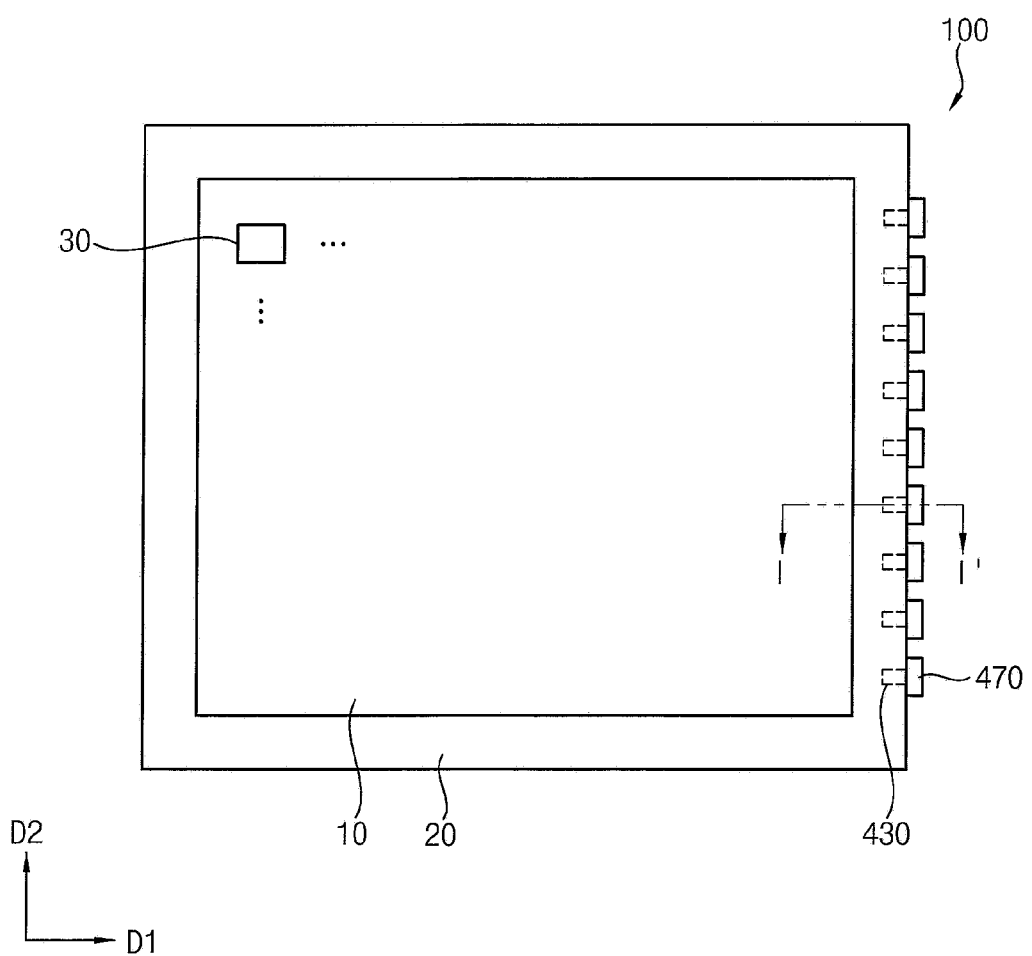
FIG. 1 is a plan view of an exemplary embodiment of an organic light emitting diode display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
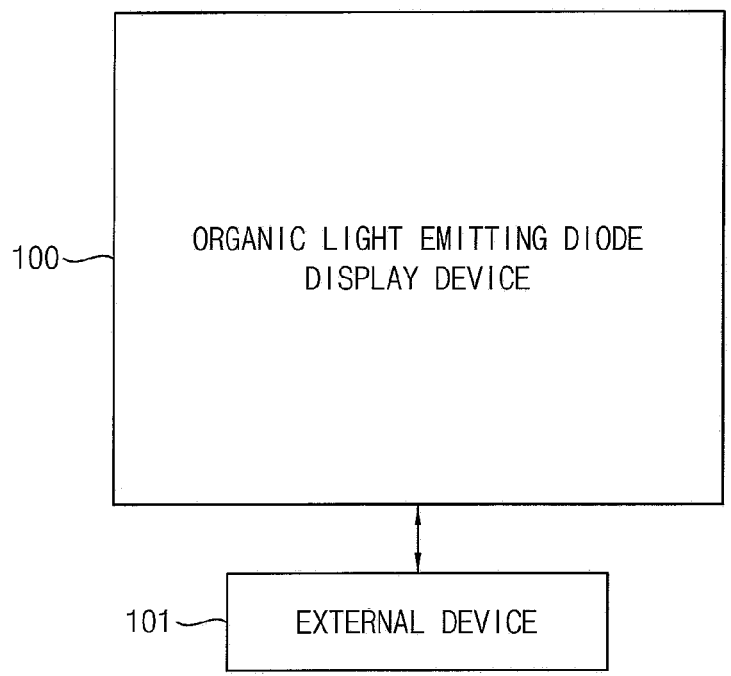
FIG. 2 is a block diagram illustrating a connection between an external device and the organic light emitting diode display device of FIG. 1.

FIG. 1 is a plan view of an exemplary embodiment of an organic light emitting diode display device constructed according to the principles of the invention. FIG. 2 is a block diagram illustrating a connection between an external device and the organic light emitting diode display device of FIG. 1.

Referring to FIGS. 1 and 2, an organic light emitting diode display device 100 is illustrated for descriptive convenience, but the principles of the invention may be applied to other types of display devices. Thus, the exemplary embodiments are not limited to any particular type of display device. The organic light emitting diode display device 100 may include pad electrodes 430, side electrodes 470, and the like, and may have a display area 10 and a peripheral area 20. The peripheral area 20 may substantially surround the display area 10.

The display area 10 may include a plurality of pixel areas 30. The pixel areas 30 may be arranged in an overall portion of the display area 10 in a matrix form. For example, a representative pixel circuit PIXEL CIRCUIT (PC) may be disposed in each of the pixel areas 30, and an organic light emitting diode OLED may be disposed on the pixel circuit PC. For example, the pixel circuit PC may include a semiconductor element 250 shown in FIG. 4, and the organic light emitting diode OLED may include a pixel structure 200 shown in FIG. 4. An image may be displayed in the display area 10 through the pixel circuit PC and the organic light emitting diode OLED.

For example, first, second and third pixel circuits may be disposed in the pixel areas 30. The first pixel circuit may be connected to a first organic light emitting diode that may emit red light, the second pixel circuit may be connected to a second organic light emitting diode that may emit green light, and the third pixel circuit may be connected to a third organic light emitting diode that may emit blue light.

The first organic light emitting diode may be disposed to overlap the first pixel circuit, the second organic light emitting diode may be disposed to overlap the second pixel circuit, and the third organic light emitting diode may be disposed to overlap the third pixel circuit. Alternatively, the first organic light emitting diode may be disposed to overlap a part of the first pixel circuit and a part of a pixel circuit different from the first pixel circuit, the second organic light emitting diode may be disposed to overlap a part of the second pixel circuit and a part of a pixel circuit different from the second pixel circuit, and the third organic light emitting diode may be disposed to overlap a part of the third pixel circuit and a part of a pixel circuit different from the third pixel circuit. For example, the first to third organic light emitting diodes may be arrayed using a sub-pixel arrangement scheme such as an RGB stripe type in which rectangles having substantially the same size are sequentially arranged, an S-stripe type including a blue organic light emitting diode having a relatively large area, a WRGB type further including a white organic light emitting diode, and a PenTile arranged to have an RG-GB repetition pattern.

In addition, at least one driving transistor, at least one switching transistor, at least one capacitor, and the like may be disposed in each of the pixel areas 30. In exemplary embodiments, one driving transistor and six switching transistors one storage capacitor, and the like may be disposed in each of the pixel areas 30. For example, the one driving transistor may include a first transistor TR1 shown in FIG. 3, the six switching transistors may include second to seventh transistors TR2, TR3, TR4, TR5, TR6, and TR7 shown in FIG. 3, and the one storage capacitor may include a storage capacitor CST shown in FIG. 3.

The display area 10, the pixel area 30, and the peripheral area 20 have been described as having a rectangular shape when viewed in plan, but exemplary embodiments are not limited thereto. For example, each of the display area 10, the pixel area 30, and the peripheral area 20 may have a triangular plane shape, a rhombus plane shape, a polygonal plane shape, a circular plane shape, a track plane shape, or an oval plane shape.

A plurality of wirings may be disposed in the peripheral area 20. For example, the wirings may include a data signal wiring, a gate signal wiring, a light emission control signal wiring, a gate initialization signal wiring, an initialization voltage wiring, a power supply voltage wiring, and the like. The wirings may extend from the peripheral area 20 to the display area 10 so as to be electrically connected to the pixel circuit PC and the organic light emitting diode OLED.

A plurality of pad electrodes 430 may be disposed in one side of the peripheral area 20, e.g., a right side of the display area 10. A plurality of side electrodes 470 may be disposed on a lower substrate (which will be described below), each side of the lower substrate, and a portion of the pad electrodes 430.

Figure 10:
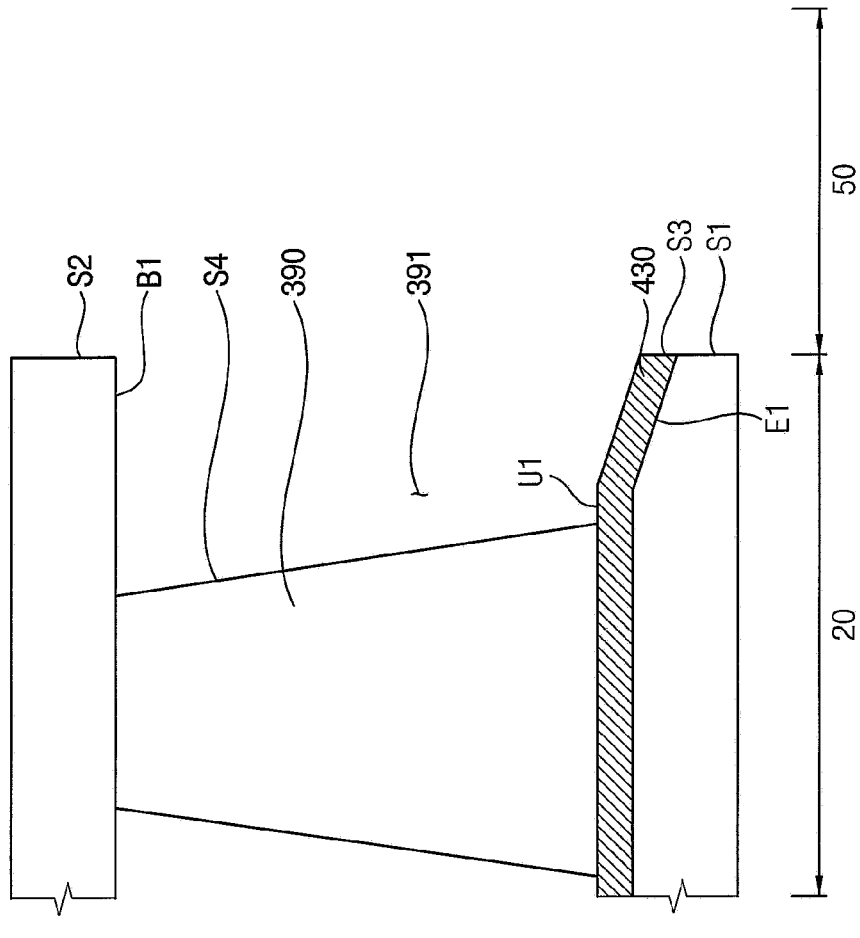
Figure 10:
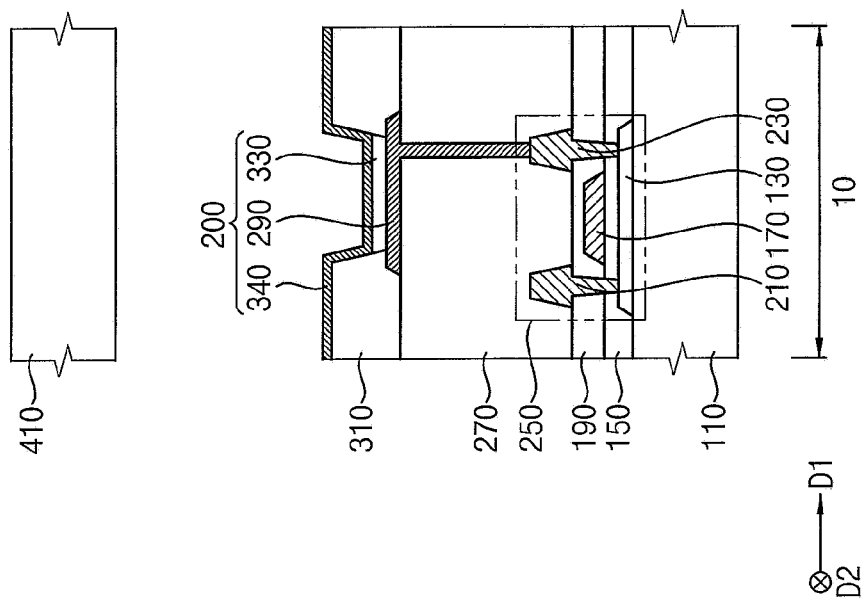

The pad electrodes 430 may be interposed between the lower substrate and the upper substrate, and a part of each of the pad electrodes 430 may be exposed (see FIG. 10). In addition, each of the pad electrodes 430 may extend in a direction from the peripheral area 20 to the display area 10, and may be electrically connected to pixel structures 200. For example, the pad electrode 430 may be connected to the wirings disposed in the display area 10.

In addition, each of the side electrodes 470 may be in direct contact with the exposed part of each of the pad electrodes 430. In other words, each of the side electrodes 470 may be disposed on one or more of the sides of the lower and upper substrates while substantially completely covering the exposed part of each of the pad electrodes 430.

For example, the pad electrodes 430 may include first to n-th pad electrodes (where, n is an integer of 1 or greater), and the first to n-th pad electrodes may be arranged to be spaced apart from each other in a second direction D2 orthogonal to a first direction D1 in the peripheral area 20. In addition, the side electrodes 470 may include first to m-th side electrodes (where, m is an integer of 1 or greater), and each of the first to m-th side electrodes may be in direct contact with each of the first to n-th pad electrodes.

The side electrodes 470 may be electrically connected to an external device 101. For example, the external device 101 may generate a gate signal, a data signal, an initialization signal, an initialization voltage, a light emission control signal, and a power supply voltage, or the like. The external device 101 may be electrically connected to the organic light emitting diode display device 100 through the side electrodes 470, the pad electrodes 430, the wirings, and the flexible printed circuit board. The gate signal, data signal, initialization signal, initialization voltage, light emission control signal, power supply voltage, or the like may be provided to semiconductor elements and pixel structures included in the organic light emitting diode display device 100 through the flexible printed circuit board, the side electrodes 470, the pad electrodes 430, and the wirings. For example, a first portion of the flexible printed circuit board may be in direct contact with the side electrodes 470. A second portion facing the first portion of the flexible printed circuit board may be in direct contact with the external device 101. In addition, a drive integrated circuit may be mounted on the flexible printed circuit board.

Although it has been described that the pad electrodes 430 and the side electrodes 470 are disposed only on the right side of the peripheral area 20 of the organic light emitting diode display device 100, exemplary embodiments are not limited thereto. For example, the pad electrodes 430 and the side electrodes 470 in the organic light emitting diode display device 100 also may be disposed on one or more of the left, upper, or lower sides of the peripheral area 20.

Although the display area 10 and the peripheral area 20 shown in FIG. 1 have been described as having a generally rectangular plane shape, the shapes of the display area 10 and the peripheral area 20 are not limited thereto. For example, each of the display area 10 and the peripheral area 20 may have a generally triangular plane shape, a generally rhombus plane shape, a generally polygonal plane shape, a generally circular plane shape, a generally annular plane shape, or a generally oval plane shape.

Figure 3:
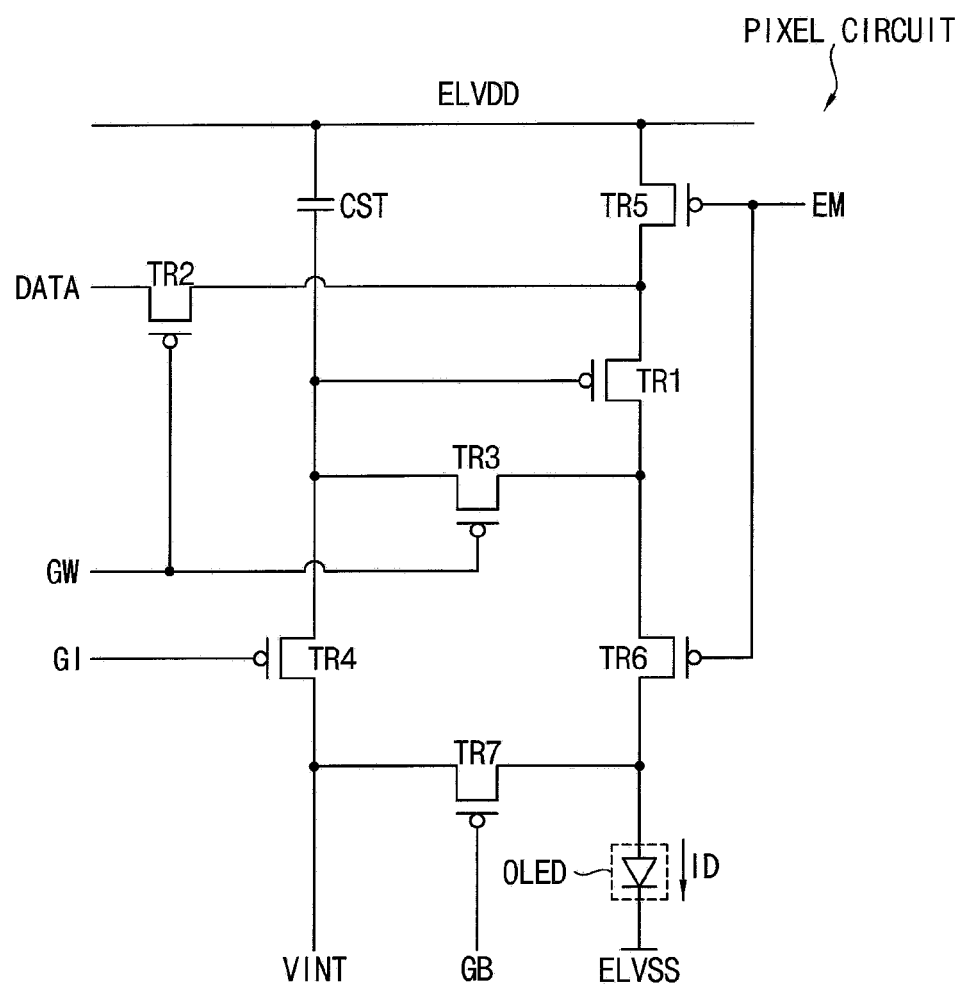
FIG. 3 is a circuit diagram of an organic light emitting diode and transistors in the organic light emitting diode display device of FIG. 1.

FIG. 3 is a circuit diagram of an organic light emitting diode and transistors included in the organic light emitting diode display device of FIG. 1.

Referring to FIG. 3, a representative pixel circuit PC and an organic light emitting diode OLED may be disposed in each of the pixel areas 30 of the organic light emitting diode display device 100. Each pixel circuit PC may include an organic light emitting diode OLED, first to seventh transistors TR1, TR2, TR3, TR4, TR5, TR6, and TR7, a storage capacitor CST, a high power voltage wiring for a high power voltage ELVDD, a low power supply voltage wiring for a low power supply voltage ELVSS, an initialization voltage wiring for an initialization voltage VINT, a data signal wiring for a data signal DATA, a gate signal wiring for a gate signal GW, a gate initialization signal wiring for a gate initialization signal GI, a light emission control signal wiring for a light emission control signal EM, a diode initialization signal wiring for a diode initialization signal GB, and the like. For example, the organic light emitting diode OLED may include the pixel structure 200 of FIG. 4.

The first transistor TR1 may correspond to a driving transistor, and the second to seventh transistors TR2, TR3, TR4, TR5, TR6, and TR7 may correspond to a switching transistor. Each of the first to seventh transistors TR1, TR2, TR3, TR4, TR5, TR6, and TR7 may include a first terminal, a second terminal, a channel, and a gate terminal. In exemplary embodiments, the first terminal may be a source terminal, and the second terminal may be a drain terminal. Alternatively, the first terminal may be a drain terminal, and the second terminal may be a source terminal.

The organic light emitting diode OLED may emit light according to a driving current ID flowing therethrough. The organic light emitting diode OLED may include the first terminal and the second terminal. In exemplary embodiments, the second terminal of the organic light emitting diode OLED may be supplied with a low power supply voltage ELVSS, and the first terminal of the organic light emitting diode OLED may be supplied with a high power voltage ELVDD. For example, the first terminal of the organic light emitting diode OLED may be an anode terminal, and the second terminal of the organic light emitting diode OLED may be a cathode terminal. Alternatively, the first terminal of the organic light emitting diode OLED may be a cathode terminal, and the second terminal of the organic light emitting diode OLED may be an anode terminal. In exemplary embodiments, the anode terminal of the organic light emitting diode OLED may correspond to the lower electrode 290 shown in FIG. 4, and the cathode terminal of the organic light emitting diode OLED may correspond to the upper electrode 340 shown in FIG. 4.

The first transistor TR1 may generate a driving current ID. In exemplary embodiments, the first transistor TR1 may operate in a saturation area. In this case, the first transistor TR1 may generate the driving current ID according to the voltage difference between the gate terminal and the source terminal. In addition, a tone wedge (e.g., color gradation) may be expressed based on the amount of the driving current ID supplied to the organic light emitting diode OLED. Alternatively, the first transistor TR1 may operate in a linear region. In this case, the tone wedge (e.g., color gradation) may be expressed based on the sum of times for supplying the driving current to the organic light emitting diode OLED in one frame.

The gate terminal of the second transistor TR2 may be supplied with the gate signal GW. The first terminal of the second transistor TR2 may be supplied with the data signal DATA. The second terminal of the second transistor TR2 may be connected to the first terminal of the first transistor TR1. The second transistor TR2 may supply the data signal DATA to the first terminal of the first transistor TR1 during an activation period of the gate signal GW. In this case, the second transistor TR2 may operate in a linear region.

The gate terminal of the third transistor TR33 may be supplied with the gate signal GW. The first terminal of the third transistor TR3 may be connected to the gate terminal of the first transistor TR1. The second terminal of the third transistor TR3 may be connected to the second terminal of the first transistor TR1. The third transistor TR3 may connect the gate terminal of the first transistor TR1 to the second terminal of the first transistor TR1 during the activation period of the gate signal GW. In this case, the third transistor TR3 may operate in a linear region. In other words, the third transistor TR3 may diode-connect the first transistor TR1 during the activation period of the gate signal GW.

The initialization voltage wiring provided with the initialization voltage VINT may be connected to the first terminal of the fourth transistor TR4 and the first terminal of the seventh transistor TR7. The second terminal of the fourth transistor TR4 may be connected to the first terminal of the storage capacitor CST.

The gate terminal of the fourth transistor TR4 may be supplied with the gate initialization signal GI. The first terminal of the fourth transistor TR4 may be supplied with the initialization voltage VINT. The second terminal of the fourth transistor TR4 may be connected to the gate terminal of the first transistor TR1.

The fourth transistor TR4 may supply the initialization voltage VINT to the gate terminal of the first transistor TR1 during an activation period of the gate initialization signal GI. In this case, the fourth transistor TR4 may operate in a linear region. In other words, the fourth transistor TR4 may initialize the gate terminal of the first transistor TR1 into the initialization voltage VINT during the activation period of the gate initialization signal GI. In exemplary embodiments, the initialization voltage VINT may have a voltage level sufficiently lower than a voltage level of the data signal DATA maintained by the storage capacitor CST in a previous frame, and the initialization voltage VINT may be supplied to the gate terminal of the first transistor TR1. In other exemplary embodiments, the initialization voltage may have a voltage level sufficiently higher than the voltage level of the data signal maintained by the storage capacitor in the previous frame, and the initialization voltage may be supplied to the gate terminal of the first transistor TR1.

The gate terminal of the fifth transistor TR5 may be supplied with a light emission control signal EM. The first terminal of the fifth transistor TR5 may be connected to the high power supply voltage ELVDD wiring. The second terminal of the fifth transistor TR5 may be connected to the first terminal of the first transistor TR1. The fifth transistor TR5 may supply the high power supply voltage ELVDD to the first terminal of the first transistor TR1 during an activation period of the light emission control signal EM. On the contrary, the fifth transistor TR5 may block the supply of the high power supply voltage ELVDD during an inactivation period of the light emission control signal EM. In this case, the fifth transistor TR5 may operate in a linear region. The fifth transistor TR5 may supply the high power supply voltage ELVDD to the first terminal of the first transistor TR1 during the activation period of the light emission control signal EM, so that the first transistor TR1 may generate the driving current ID. In addition, the fifth transistor TR5 may block the supply of the high power supply voltage ELVDD during the inactivation period of the light emission control signal EM, so that the data signal DATA supplied to the first terminal of the first transistor TR1 may be supplied to the gate terminal of the first transistor TR1.

Figure 4:
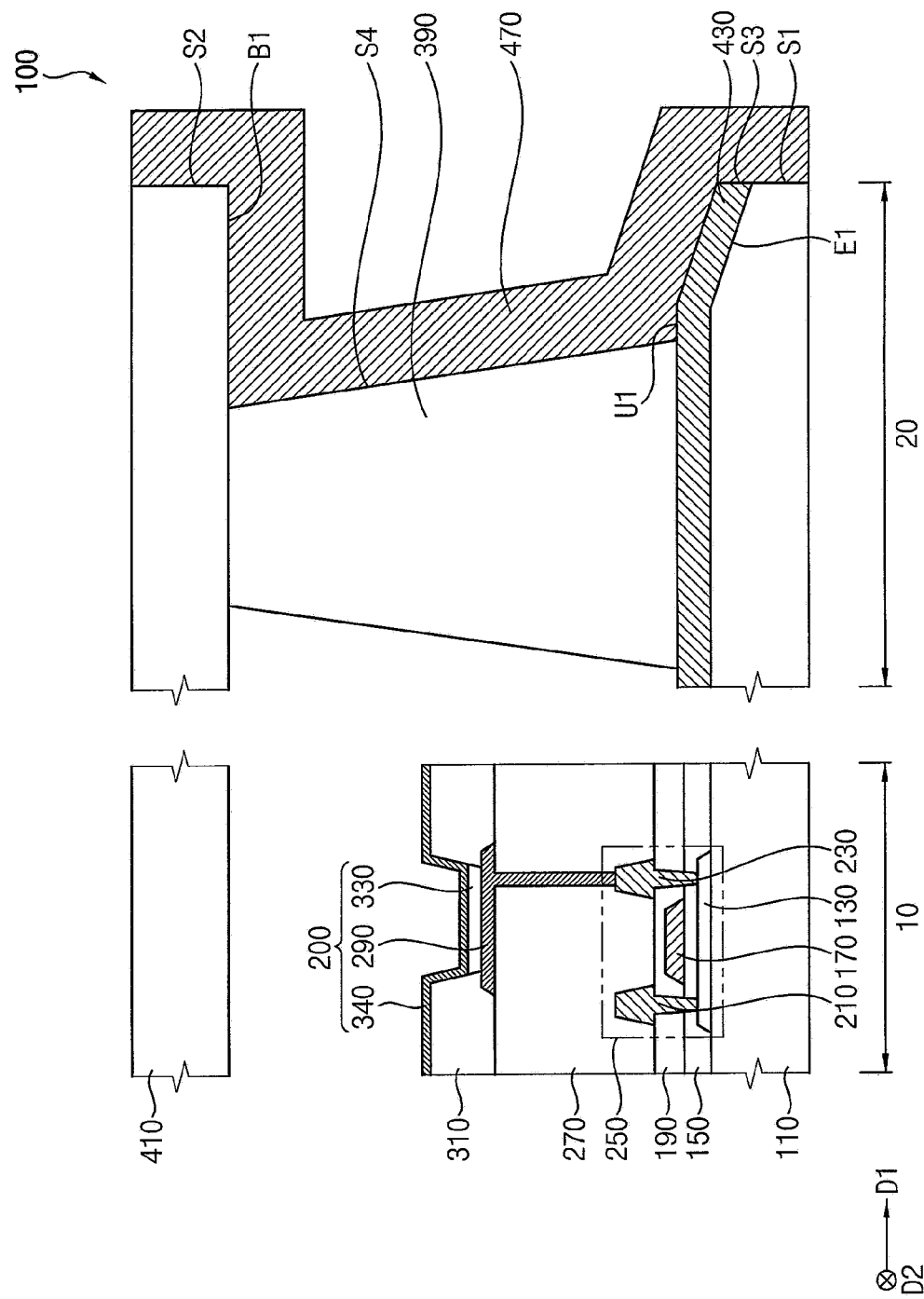
FIG. 4 is a cross-sectional view taken along line I-I' of FIG. 1.

The gate terminal of the sixth transistor TR6, e.g., the semiconductor element 250 in FIG. 4, may be supplied with the light emission control signal EM. The first terminal of the sixth transistor TR6 may be connected to the second terminal of the first transistor TR1. The second terminal of the sixth transistor TR6 may be connected to the first terminal of the organic light emitting diode OLED. The sixth transistor TR6 may supply the driving current ID generated by the first transistor TR1 to the organic light emitting diode OLED during the activation period of the light emission control signal EM. In this case, the sixth transistor TR6 may operate in the linear region. In other words, the sixth transistor TR6 may supply the driving current ID generated by the first transistor TR1 to the organic light emitting diode OLED during the activation period of the light emission control signal EM, so that the organic light emitting diode OLED may output light. In addition, the sixth transistor TR6 electrically isolates the first transistor TR1 and the organic light emitting diode OLED from each other during the inactivation period of the light emission control signal EM, so that the data signal DATA supplied to the second terminal of the first transistor TR1 may be supplied to the gate terminal of the first transistor TR1. For example, the data signal DATA supplied to the second terminal of the first transistor TR1 may be a data signal compensated from the data signal DATA provided from the data signal wiring by a threshold voltage of the first transistor TR1.

The gate terminal of the seventh transistor TR7 may be supplied with a diode initialization signal GB. The first terminal of the seventh transistor TR7 may be supplied with the initialization voltage VINT. The second terminal of the seventh transistor TR7 may be connected to the first terminal of the organic light emitting diode OLED. The seventh transistor TR7 may supply the initialization voltage VINT to the first terminal of the organic light emitting diode OLED during an activation period of the diode initialization signal GB. In this case, the seventh transistor TR7 may operate in a linear region. In other words, the seventh transistor TR7 may initialize the first terminal of the organic light emitting diode OLED into the initialization voltage VINT during the activation period of the diode initialization signal GB.

Figure 8:
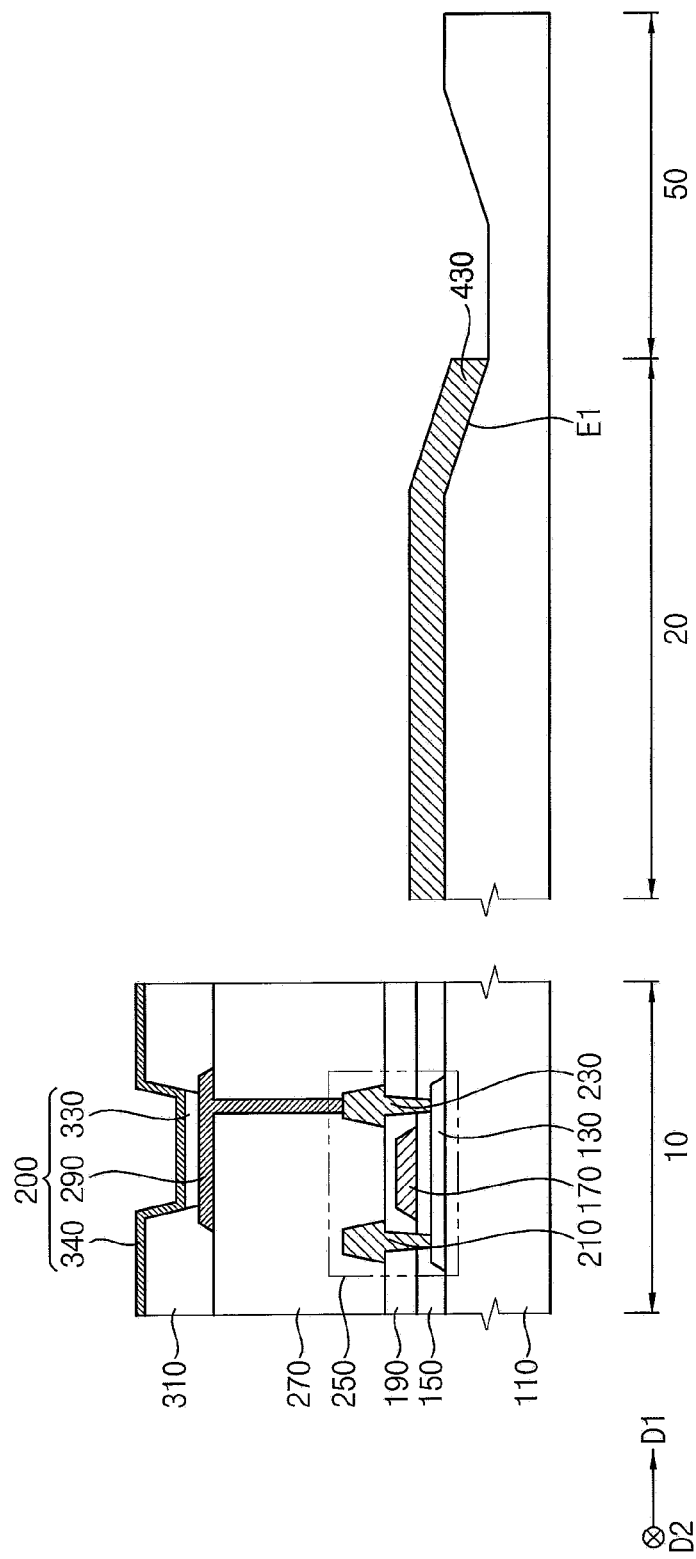

The storage capacitor CST, e.g., the storage capacitor 180 of FIG. 8, may include a first terminal and a second terminal. The storage capacitor CST may be connected between the high power supply voltage ELVDD wiring and the gate terminal of the first transistor TR1. For example, the first terminal of the storage capacitor CST may be connected to the gate terminal of the first transistor TR1, and the second terminal of the storage capacitor CST may be connected to the high power supply voltage ELVDD wiring. The storage capacitor CST may maintain a voltage level of the gate terminal of the first transistor TR1 during an inactivation period of the gate signal GW. The inactivation period of the gate signal GW may include the activation period of the light emission control signal EM, and a driving current ID generated by the first transistor TR1 during the activation period of the light emission control signal EM may be supplied to the organic light emitting diode OLED. Accordingly, the driving current ID generated by the first transistor TR1 may be supplied to the organic light emitting diode OLED based on the voltage level maintained by the storage capacitor CST.

Although the representative pixel circuit PC has been described as including seven transistors and one storage capacitor, exemplary embodiments are not limited thereto. For example, the pixel circuit PC may be configured to include at least one transistor and at least one storage capacitor.

FIG. 4 is a cross-sectional view taken along line I-I' of FIG. 1.

Referring to FIG. 4, the organic light emitting diode display device 100 may include a lower substrate 110, a semiconductor element 250, a pad electrode 430, a planarization layer 270, a pixel defining layer 310, a pixel structure 200, an upper substrate 410, a sealing member 390, a side electrode 470, and the like. The semiconductor element 250 may include an active layer 130, a gate insulating layer 150, a gate electrode 170, an insulating interlayer 190, a source electrode 210, and a drain electrode 230, and the pixel structure 200 may include a lower electrode 290, a light emitting layer 330, and an upper electrode 340.

As described above, the organic light emitting diode display device 100 may include a display area 10 and a peripheral area 20. For example, an image may be displayed in the display area 10 through the pixel structure 200 and the semiconductor element 250. The lower substrate 110 may be hermetically coupled to the upper substrate 410 through the sealing member 390 in the peripheral area 20.

The lower substrate 110 may include a transparent or opaque material. The lower substrate 110 may include a quartz substrate, a synthetic quartz substrate, a calcium fluoride substrate, a fluorine-doped (F-doped) quartz substrate, a soda-lime glass substrate, a non-alkali glass substrate, and the like. In exemplary embodiments, the lower substrate 110 may have an inclined surface E1 at an outer portion of the peripheral area 20. In addition, as the organic light emitting diode display device 100 has a display area 10 and a peripheral area 20, the lower substrate 110 may also be divided into a display area 10 and a peripheral area 20. For example, the peripheral area 20 shown in FIG. 4 may correspond to the peripheral area 20 positioned on the right side of the display area 10 in the peripheral areas 20 shown in FIG. 1.

A buffer layer may be disposed on the lower substrate 110. The buffer layer may be disposed on an overall portion of the lower substrate 110. The buffer layer may prevent metal atoms or impurities from diffusing from the lower substrate 110 to the semiconductor element 250 and the pixel structure 200, and may enable a substantially uniform active layer 130 to be obtained by adjusting the rate of heat transfer during crystallization process for forming the active layer 130. In addition, when the surface of the lower substrate 110 is not uniform, the buffer layer may serve to improve the flatness of the surface of the lower substrate 110. According to the type of substrate 110, at least two buffer layers may be provided on the substrate 110, or the buffer layer may not be disposed thereon. For example, the buffer layer may include an organic material or an inorganic material.

The active layer 130 may be disposed in the display area 10 on the lower substrate 110, and may include a metal oxide semiconductor, an inorganic semiconductor (e.g., amorphous silicon and poly silicon), an organic semiconductor, and the like. The semiconductor element 250 may have a source area, a drain area and a channel area positioned between the source area and the drain area.

The gate insulating layer 150 may be disposed on the active layer 130. The gate insulating layer 150 may cover the active layer 130 in the display area 10 on the lower substrate 110, and may be disposed in an overall portion of the display area 10 on the lower substrate 110. In exemplary embodiments, the gate insulating layer 150 may not be disposed in the peripheral area 20 on the lower substrate 110. In other exemplary embodiments, the gate insulating layer 150 may be disposed in an overall portion of the display area 10 and the peripheral area 20 on the lower substrate 110. The gate insulating layer 150 may sufficiently and substantially cover the entire active layer 130 on the lower substrate 110, and may have a substantially planar upper surface without generating a step around the active layer 130. Alternatively, the gate insulating layer 150 may be disposed to have a substantially uniform thickness along a profile of the active layer 130 while covering the active layer 130 on the lower substrate 110. The gate insulating layer 150 may include a silicon compound, metal oxide, and the like. For example, the gate insulating layer 150 may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), and the like. In other exemplary embodiments, the gate insulating layer 150 may have a multi-layer structure including a plurality of insulating layers. The insulating layers may have mutually different materials and different thicknesses.

The gate electrode 170 may be disposed in the display area 10 on the gate insulating layer 150. In other words, the gate electrode 170 may be disposed on a portion of the gate insulating layer 150 below which the channel area of the active layer 130 is positioned. The gate electrode 170 may include a metal, an alloy, a metal nitride, a conductive metal oxide, a transparent conductive material, and the like. These may be used individually or in combination to form the gate electrode 170. In other exemplary embodiments, the gate electrode 170 may have a multi-layer structure including a plurality of metal layers. The metal layers may have mutually different materials and mutually different thicknesses.

An insulating interlayer 190 may be disposed on the gate electrode 170. The insulating interlayer 190 may cover the gate electrode 170 in the display area 10 on the gate insulating layer 150, and may be disposed on an overall portion of the gate insulating layer 150. In exemplary embodiments, the insulating interlayer 190 may not be disposed in the peripheral area 20 on the lower substrate 110. In other exemplary embodiments, the gate insulating layer 150 may be disposed in overall portions of the display area 10 and the peripheral area 20 on the lower substrate 110. The insulating interlayer 190 may sufficiently and substantially cover the entire gate electrode 170 on the gate insulating layer 150, and may have a substantially planar upper surface without generating a step around the gate electrode 170. Alternatively, the insulating interlayer 190 may be disposed to have a uniform thickness along the profile of the gate electrode 170 while covering the gate electrode 170 on the gate insulating layer 150. The insulating interlayer 190 may include a silicon compounds, metal oxides, and the like.

The source electrode 210 and the drain electrode 230 may be disposed in the display area 10 on the insulating interlayer 190. The source electrode 210 may be connected to the source area of the active layer 130 through a contact hole formed by removing first portions of the gate insulating layer 150 and the insulating interlayer 190. The drain electrode 230 may be connected to the drain area of the active layer 130 through a contact hole formed by removing second portions of the gate insulating layer 150 and the insulating interlayer 190. Each of the source electrode 210 and the drain electrode 230 may include a metal, an alloy, a metal nitride, a conductive metal oxide, a transparent conductive material, and the like. These may be used individually or in combination to form the source electrode 210 and the drain electrode 230. In other exemplary embodiments, each of the source electrode 210 and the drain electrode 230 may have a multi-layer structure including a plurality of metal layers. The metal layers may have mutually different materials and mutually different thicknesses.

Therefore, a semiconductor element 250 including the active layer 130, the gate insulating layer 150, the gate electrode 170, the insulating interlayer 190, the source electrode 210, and the drain electrode 230 may be disposed on the display area 10.

Although the organic light emitting diode display device 100 has been described as including one transistor (e.g., a semiconductor element 250), the configurations of the exemplary embodiments are not limited thereto. For example, the organic light emitting diode display device 100 may be configured to include at least two transistors and at least one capacitor.

In addition, although the semiconductor element 250 has been described as having an upper gate structure, the configurations of the exemplary embodiments are not limited thereto. For example, the semiconductor element 250 may have a bottom gate structure and/or double gate structure.

The pad electrodes 430 may be disposed on the lower substrate 110 in the peripheral area 20. In exemplary embodiments, the pad electrodes 430 may be disposed on the downwardly inclined surface E1 of the lower substrate 110 in the peripheral area 20 between the lower substrate 110 and the upper substrate 410. In addition, the pad electrodes 430 may protrude from the sealing member 390 on the lower substrate 110 in a first direction D1 that is a direction from the display area 10 to the peripheral area 20. In addition, the pad electrode 430 may extend from the inclined surface E1 on the lower substrate 110 in an inward direction from the peripheral area 20 to the display area 10, and may be electrically connected to the semiconductor element 250 or the pixel structure 200.

In addition, first ends of the pad electrodes 430 may be substantially aligned on an outermost surface (for example, the side surface of the lower substrate 110) of the organic light emitting diode display device 100. In addition, second ends opposite to the first ends of the pad electrodes 430 may be connected to one of the gate signal wiring, the data signal wiring, the power supply voltage wiring, the initialization signal wiring, the initialization voltage wiring, and the light emission control signal wiring. For example, one of the gate signal, data signal, power supply voltage, initialization signal, initialization voltage, and emission control signal generated from the external device 101 may be transmitted to the pixel structure 200 through the flexible printed circuit board and side electrodes 470.

The pad electrode 430 may include a metal, an alloy, a metal nitride, a conductive metal oxide, a transparent conductive material, and the like. The pad electrode 430 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, aluminum nitride (AlN), an alloy containing silver, tungsten nitride (WN), an alloy containing copper, an alloy containing molybdenum, titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), and the like. These may be used individually or in combination to form the pad electrode 430. In exemplary embodiments, the pad electrode 430, the source electrode 210 and the drain electrode 230 may be simultaneously formed of the same material. Alternatively, a conductive wiring electrically connected to the pad electrode 430 may be additionally disposed under the pad electrode 430, and the conductive wiring may be simultaneously formed of the same material as the gate electrode 170. In other exemplary embodiments, the pad electrode 430 may have a multi-layer structure including a plurality of metal layers. The metal layers may have mutually different materials and mutually different thicknesses.

The planarization layer 270 may be disposed in the display area 10 on the insulating interlayer 190, the source electrode 210, and the drain electrode 230. For example, the planarization layer 270 may be relatively thickly formed to sufficiently cover the source and drain electrodes 210 and 230 on the insulating interlayer 190. In this case, the planarization layer 270 may have a substantially planar upper surface, and a planarization process may be added to the planarization layer 270 to implement the above planar upper surface of the planarization layer 270. A part of the top surface of the drain electrode 230 may be exposed through the contact hole formed by removing a part of the planarization layer 270. The planarization layer 270 may include an organic material, an inorganic material or the like. In exemplary embodiments, the planarization layer 270 may include an organic material. For example, the planarization layer 270 may include photoresist, polyacryl-based resin, polyimide-based resin, polyamide-based resin, siloxane-based resin, acryl-based resin, epoxy-based resin, and the like.

The lower electrode 290 may be disposed in the display area 10 on the planarization layer 270. The lower electrode 290 may be connected to the drain electrode 230 by passing through the contact hole of the planarization layer 270. In addition, the lower electrode 290 may be electrically connected to the semiconductor element 250. The lower electrode 290 may include a metal, an alloy, a metal nitride, a conductive metal oxide, a transparent conductive material, and the like. These may be used individually or in combination to form the lower electrode 290. In other exemplary embodiments, the lower electrode 290 may have a multi-layer structure including a plurality of layers. The metal layers may have mutually different materials and mutually different thicknesses.

The pixel defining layer 310 may be disposed in the display area 10 on the planarization layer 270 and a portion of the lower electrode 290. The pixel defining layer 310 may cover both sides of the lower electrode 290, and may expose a part of the top surface of the lower electrode 290. The pixel defining layer 310 may be formed of an organic material or an inorganic material. In exemplary embodiments, the pixel defining layer 310 may include an organic material.

The light emitting layer 330 may be disposed in the display area 10 on the lower electrode 290 exposed by the pixel defining layer 310. The light emitting layer 330 may be formed of at least one of light emitting materials capable of emitting different color lights (e.g., red light, green light, and blue light) according to their pixel structures. For example, the light emitting layer 330 may be formed by laminating a plurality of light emitting materials capable of generating different color lights (e.g., red light, green light and blue light) to emit white light as a whole. In this case, a color filter may be disposed on the light emitting layer 330. For example, the color filter may overlap the light emitting layer 330 on a bottom or top surface of the upper substrate 410. The color filter may include at least one of a red color filter, a green color filter, and a blue color filter. Further, the color filter may include a yellow color filter, a cyan color filter, and a magenta color filter. The color filter may include photo-sensitive resin or color photoresist.

The upper electrode 340 may be disposed in the display area 10 on the pixel defining layer 310 and the light emitting layer 330. The upper electrode 340 may include a metal, an alloy, a metal nitride, a conductive metal oxide, a transparent conductive material, and the like. These may be used individually or in combination to form the upper electrode 340. In other exemplary embodiments, the upper electrode 340 may have a multi-layer structure including a plurality of metal layers. The metal layers may have mutually different materials and mutually different thicknesses.

Accordingly, the pixel structure 200 including the lower electrode 290, the light emitting layer 330, and the upper electrode 340 may be disposed on the display area 10.

The sealing member 390 may be disposed in the peripheral area 20 on the pad electrode 430. In detail, the sealing member 390 may be disposed along the peripheral area 20 between the lower substrate 110 and the upper substrate 410, and may have a substantially hollow rectangular shape. The top surface of the sealing member 390 may be in direct contact with the bottom surface of the upper substrate 410, and the bottom surface of the sealing member 390 may be in direct contact with a part of the pad electrode 430. In exemplary embodiments, the sealing member 390 may cover a part of the pad electrode 430 and may not overlap the first end of the pad electrode 430. For example, the sealing member 390 may not overlap the inclined surface E1 of the lower substrate 110. The sealing member 390 may include a frit and the like. In addition, the sealing member 390 may further include a photo-curable material. For example, the sealing member 390 may include a mixture of an organic material and a photo-curable material, and the sealing member 390 may be obtained by irradiating the mixture with ultraviolet rays (UV), laser beam, visible light, or the like and then curing the mixture. The photo-curable material included in the sealing member 390 may include epoxy acrylate-based resin, polyester acrylate-based resin, urethane acrylate-based resin, polybutadiene acrylate-based resin, silicone acrylate-based resin, alkyl acrylate-based resin, and the like.

For example, the mixture of the organic material and the photo-curable material may be irradiated with laser beam. Upon the irradiation of laser beam, the mixture may be changed from a solid state to a liquid state, and the mixture in the liquid state may be cured into the solid state after a predetermined time. The upper substrate 410 may be hermetically coupled to the lower substrate 110 according to the state change of the mixture.

Although the sealing member 390 of FIG. 4 has been shown as having a trapezoidal shape in which a width of the top surface is smaller than a width of the bottom surface, the configurations of the exemplary embodiments are not limited thereto. For example, the sealing member 390 may have a trapezoidal shape having the width of the top surface greater than the width of the bottom surface, a rectangular shape, a square shape, or the like.

The upper substrate 410 may be disposed on the sealing member 390 and the upper electrode 340 (for example, the pixel structure 200). In exemplary embodiments, the upper substrate 410 and the lower substrate 110 may have the same size and may overlap each other. The upper substrate 410 may include substantially the same material as the lower substrate 110. For example, the upper substrate 410 may include a quartz substrate, a synthetic quartz substrate, a calcium fluoride substrate, a fluorine-doped (F-doped) quartz substrate, a soda-lime glass substrate, a non-alkali glass substrate, and the like.

The side electrode 470 may be disposed on the outermost surface of the organic light emitting diode display device 100. For example, a side surface of the lower substrate 110, a side surface of the upper substrate 410, a side surface of the first end of the pad electrode 430, an upper surface of the first end of the pad electrode 430, and a side surface of the sealing member 390 may be defined as the outermost surface of the organic light emitting diode display device 100. The side electrode 470 may be in contact with the outermost surface of the organic light emitting diode display device 100. In addition, referring to FIG. 10, the outermost surface of the organic light emitting diode display device 100 may correspond to an inner surface of a space 391 defined by the upper substrate 410, the sealing member 390, and the pad electrode 430 in the peripheral area 20. The sealing member 390 may be disposed inside the inclined surface E1 and may not overlap the inclined surface E1. Thus, the space 391 may be formed by the upper substrate 410, the sealing member 390, and the pad electrode 430. For example, the side electrode 470 may be disposed along a profile (or the inner surface) of the space 391. In exemplary embodiments, the side electrode 470 may be in direct contact with the side surface of the first end of the pad electrode 430 and the upper surface of the first end of the first end of the pad electrode 430, and may overlap the inclined surface E1. For example, the side electrode 470 may be electrically connected to the side surface of the first end of the pad electrode 430 and the upper surface of the first end of the first end of the pad electrode 430.

Alternatively, the side electrode 470 may be in contact with a part of the side surface of the lower substrate 110, a part of the side surface of the upper substrate 410, a side surface of the first end of the pad electrode 430, an upper surface of the first end of the pad electrode 430, and a part of the side surface of the sealing member 390.

The side electrode 470 may include a metal having a relatively high metal adhesion. For example, the side electrode 470 may include Ti, Mo, Ni, Ta, Nd, and the like. In other exemplary embodiments, the side electrode 470 may include a metal, such as Au, Ag, Cu, and Al, having a relatively low resistance or may include a metal or alloy, such as an alloy containing Ti, Mo or titanium, and an alloy containing molybdenum, having a relatively high strength (for example, the metal having a Mohs hardness of 5 or more). In addition, the side electrode 470 may have a multi-layer structure including a plurality of metal layers. The metal layers may have mutually different materials and mutually different thicknesses.

An example of an organic light emitting diode display device 100 constructed according to the principles of the invention is shown in FIGS. 1, 2, 3, and 4.

In this example, side surfaces of the upper substrate 410, the sealing member 390, the pad electrode 430, and the lower substrate 110 may be aligned by removing a part of the upper substrate 410, a part of the sealing member 390, a part of the pad electrode 430 and a part of the lower substrate 110 positioned in the peripheral area 20 to allow the pad electrode 430 to be in contact with the side electrode 470. The side electrode 470 may be disposed on the side surface, and the side electrode 470 may be in contact with or may be electrically connected to the pad electrode 430. In conventional organic light emitting diode display devices, since the sectional portion of the pad electrode 430 exposed to the outside is relatively small, the contact area between the sectional portion of the pad electrode 430 and the side electrode 470 may be relatively small, and the contact resistance is large.

The organic light emitting diode display device 100 constructed according to the exemplary embodiments includes the lower substrate 110 having the inclined surface E1 so that the contact area between the pad electrode 430 and the side electrode 470 is increased compared to the conventional non-inclined contact area, and thus the contact resistance between the pad electrode 430 and the side electrode 470 may be lowered in the illustrated exemplary embodiment.

In addition, the part of the upper substrate 410 and the part of the sealing member 390 positioned in the peripheral area 20 are not removed, so that the side electrode 470 may be disposed along the profile (e.g., the inner surfaces corresponding to the side surface S1 of the lower substrate 110, the side surface S2 and the bottom surface B1 of the upper substrate 410, the side surface S3 of the distal end of the pad electrode 430, the upper surface U1 of the distal end of the pad electrode 430, and the side surface S4 of the sealing member 390 in the peripheral area 20 in FIG. 4) of the space 391. Accordingly, when the flexible circuit board is disposed on the side electrode 470 to allow the organic light emitting diode display device 100 to be electrically connected to the external device 101, the contact area between the flexible circuit board and the side electrode 470 is increased, so that the adhesion characteristics of the flexible circuit board and the side electrode 470 may be improved.

FIGS. 5 to 10 are cross-sectional views illustrating an exemplary method of manufacturing an organic light emitting diode display device according to the principles of the invention.

Figure 5:
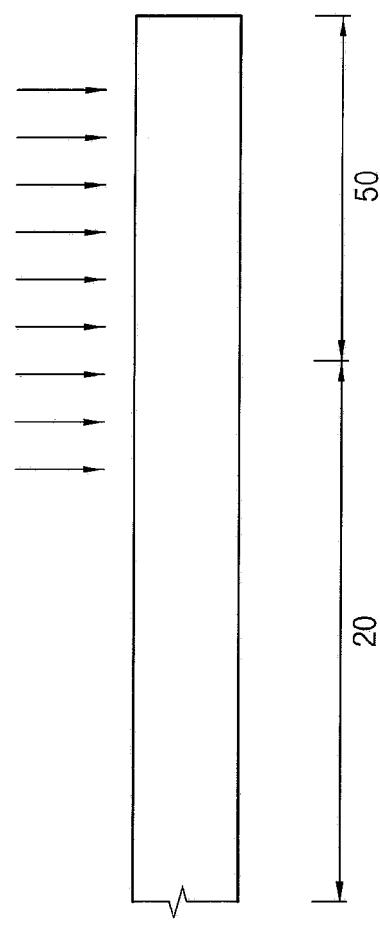
FIGS. 5, 6, 7, 8, 9, and 10 are cross-sectional views illustrating an exemplary method of manufacturing an organic light emitting diode display device according to the principles of the invention.
Figure 5:
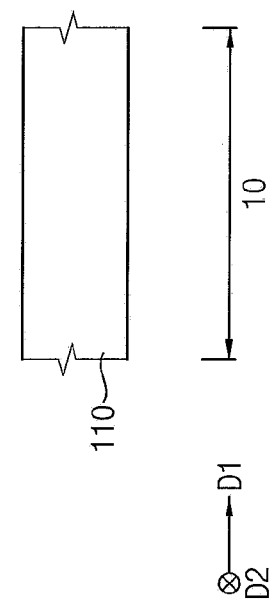

Referring to FIG. 5, the lower substrate 110 may include a transparent or opaque material. The lower substrate 110 may be divided into a display area 10, a peripheral area 20 and a dummy area 50. For example, the peripheral area 20 may substantially surround the display area 10, and the dummy area 50 may be positioned at one side of the peripheral area 20. The lower substrate 110 may include a quartz substrate, a synthetic quartz substrate, a calcium fluoride substrate, a fluorine-doped quartz substrate, a soda-lime glass substrate, a non-alkali glass substrate, or the like. After the lower substrate 110 is provided, a part of the peripheral area 20 and a part of the dummy area 50 may be irradiated by a laser.

Figure 6:
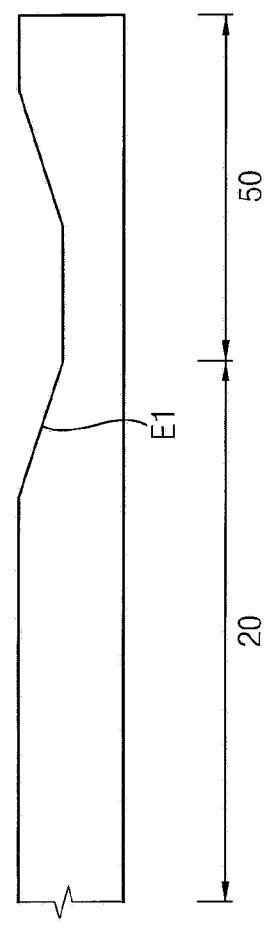
Figure 7:
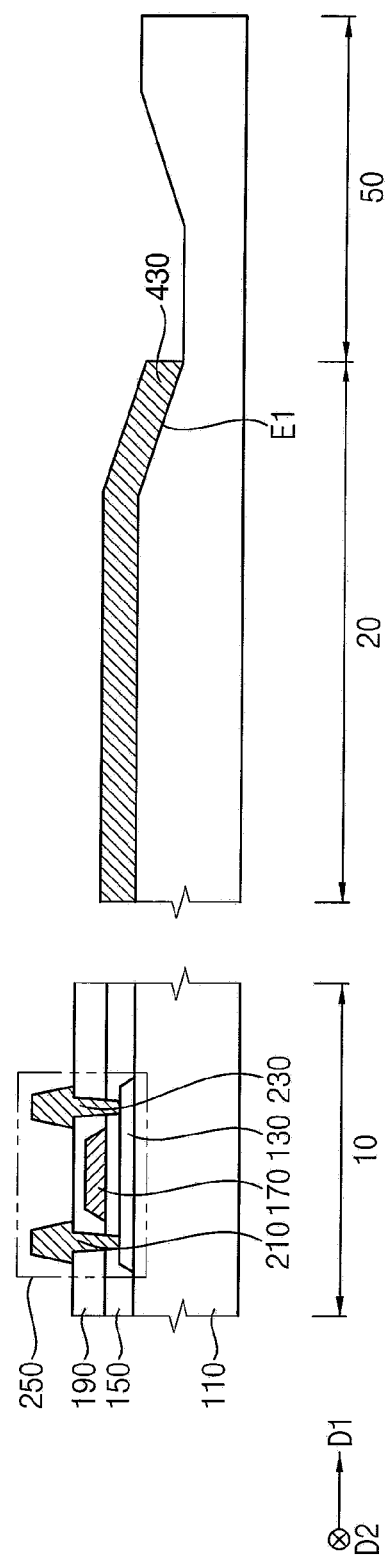

Referring to FIG. 6, grooves may be formed in the part of the peripheral area 20 and the part of the dummy area 50 by an irradiating laser beam, and inclined surfaces may be formed inside the grooves. For example, an inclined surface positioned in the peripheral area 20 among the inclined surfaces of the grooves may be defined as an inclined surface E1.

The active layer 130 may be formed in the display area 10 on the lower substrate 110, and may be formed of a metal oxide semiconductor, an inorganic semiconductor or an organic semiconductor. The semiconductor element 250 may have a source area, a drain area and a channel area positioned between the source area and the drain area.

The gate insulating layer 150 may be formed on the active layer 130. The gate insulating layer 150 may cover the active layer 130 in the display area 10 on the lower substrate 110, and may be formed in an overall portion of the display area 10 on the lower substrate 110. The gate insulating layer 150 may be formed of a silicon compound, metal oxide or the like. For example, the gate insulating layer 150 may include SiO, SiN, SiON, SiOC, SiCN, AlO, AlN, TaO, HfO, ZrO, TiO, and the like.

The gate electrode 170 may be formed in the display area 10 on the gate insulating layer 150. For example, the gate electrode 170 may be formed on a portion of the gate insulating layer 150 below which the channel area of the active layer 130 is positioned. The gate electrode 170 may be formed of a metal, an alloy, a metal nitride, a conductive metal oxide, a transparent conductive material, or the like. These may be used individually or in combination to form the gate electrode 170.

The insulating interlayer 190 may be formed on the gate electrode 170. The insulating interlayer 190 may cover the gate electrode 170 in the display area 10 on the gate insulating layer 150, and may be disposed on an overall portion of the gate insulating layer 150. The insulating interlayer 190 may be formed of a silicon compound, metal oxide or the like.

A source electrode 210 and a drain electrode 230 may be formed in the display area 10 on the insulating interlayer 190. The source electrode 210 may be connected to the source area of the active layer 130 through a contact hole formed by removing first portions of the gate insulating layer 150 and the insulating interlayer 190. The drain electrode 230 may be connected to the drain area of the active layer 130 through a contact hole formed by removing second portions of the gate insulating layer 150 and the insulating interlayer 190.

Accordingly, the semiconductor element 250 including the active layer 130, the gate insulating layer 150, the gate electrode 170, the insulating interlayer 190, the source electrode 210, and the drain electrode 230 may be formed on the display area 10.

Pad electrodes 430 may be formed to overlap the grooves in the peripheral area 20 on the lower substrate 110. In exemplary embodiments, the pad electrodes 430 may be formed to overlap the inclined surface E1 in the peripheral area 20 on the lower substrate 110, and may extend in a direction from the peripheral area 20 to the display area 10. In addition, the pad electrode 430 may be simultaneously formed of the same material as the source electrode 210 and the drain electrode 230. For example, after a preliminary electrode layer is formed on an overall portion of the lower substrate 110 in the peripheral area 20 and the insulating interlayer 190 in the display area 10, the preliminary electrode layer is partially etched, so that the pad electrode 430, the source electrode 210, and the drain electrode 230 may be simultaneously formed. Each of the pad electrode 430, the source electrode 210, and the drain electrode 230 may include a metal, an alloy, a metal nitride, a conductive metal oxide, a transparent conductive material, and the like. For example, each of the pad electrode 430, the source electrode 210, and the drain electrode 230 may include Au, Ag, Al, Pt, Ni, Ti, Pd, Mg, Ca, Li, Cr, Ta, W, Cu, Mo, Sc, Nd, Ir, an alloy containing aluminum, AlNx, an alloy containing silver, WNx, an alloy containing copper, an alloy containing molybdenum, TiN, CrN, TaN, SrRuO, ZnO, ITO, SnO, InO, GaO, IZO, and the like. These may be used individually or in combination to form the pad electrode 430, the source electrode 210, and the drain electrode 230.

Referring to FIG. 8, the planarization layer 270 may be formed in the display area 10 on the insulating interlayer 190, the source electrode 210, and the drain electrode 230. For example, the planarization layer 270 may be relatively thickly formed to sufficiently and substantially cover the entire source and drain electrodes 210 and 230 on the insulating interlayer 190. A part of the top surface of the drain electrode 230 may be exposed through the contact hole formed by removing a part of the planarization layer 270. The planarization layer 270 may be formed of an organic material. For example, the planarization layer 270 may include photoresist, polyacryl-based resin, polyimide-based resin, polyamide-based resin, siloxane-based resin, acryl-based resin, epoxy-based resin, and the like.

The lower electrode 290 may be formed in the display area 10 on the planarization layer 270. The lower electrode 290 may be connected to the drain electrode 230 by passing through the contact hole of the planarization layer 270. The lower electrode 290 may be formed of a metal, an alloy, a metal nitride, a conductive metal oxide, a transparent conductive material, or the like. These may be used individually or in combination to form the lower electrode 290.

The pixel defining layer 310 may be formed in the display area 10 on the planarization layer 270 and a part of the lower electrode 290. The pixel defining layer 310 may cover both sides of the lower electrode 290, and may expose a part of the top surface of the lower electrode 290. The pixel defining layer 310 may be formed of an organic material.

The light emitting layer 330 may be formed in the display area 10 on the lower electrode 290 exposed by the pixel defining layer 310. The light emitting layer 330 may be formed of at least one of light emitting materials capable of emitting different color lights (e.g., red light, green light, and blue light) according to their pixel structures. For example, the light emitting layer 330 may be formed by laminating a plurality of light emitting materials capable of generating different color lights (e.g., red light, green light and blue light) to emit white light as a whole.

The upper electrode 340 may be formed in the display area 10 on the pixel defining layer 310 and the light emitting layer 330. The upper electrode 340 may be formed of a metal, an alloy, a metal nitride, a conductive metal oxide, a transparent conductive material, or the like. These may be used individually or in combination to form the upper electrode 340.

Accordingly, the pixel structure 200 including the lower electrode 290, the light emitting layer 330, and the upper electrode 340 may be formed in the display area 10.

Figure 9:
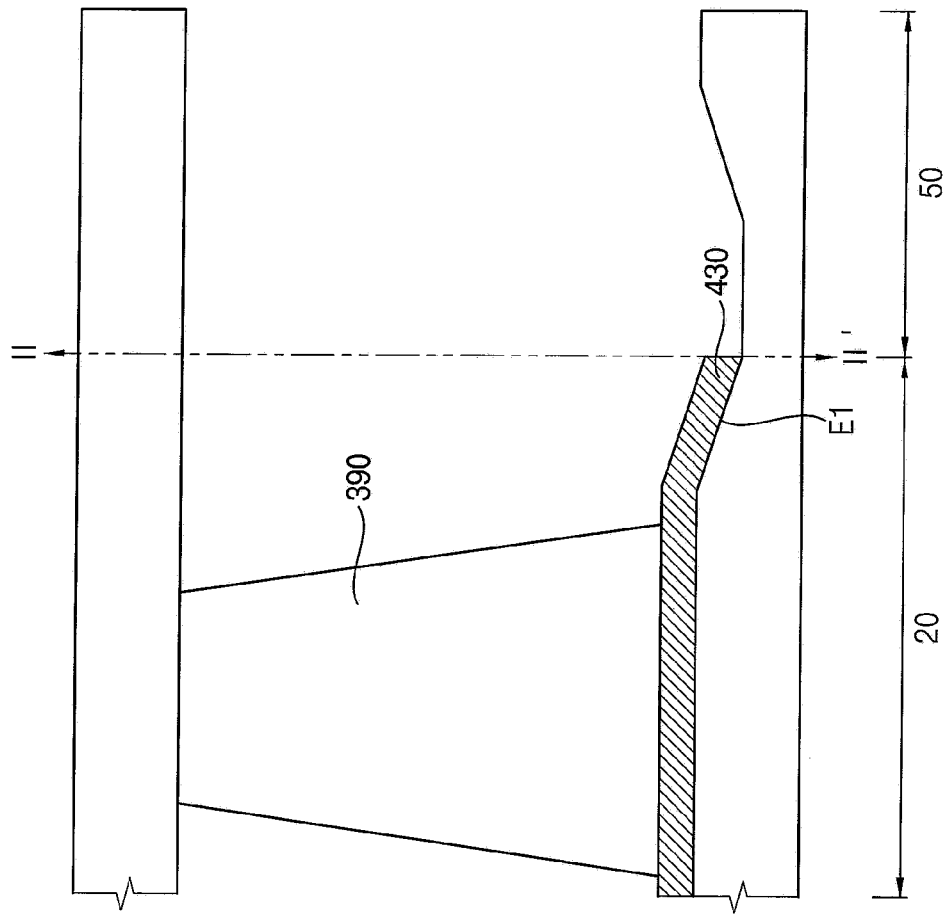

Referring to FIG. 9, the sealing member 390 may be formed in the peripheral area 20 on the pad electrode 430. In detail, the sealing member 390 may be disposed along the peripheral area 20 on the lower substrate 110, and may have a substantially hollow rectangular shape. In addition, the sealing member 390 may have various hollow shapes. The sealing member 390 may cover a part of the pad electrode 430, and may not overlap the inclined surface E1 of the lower substrate 110. The sealing member 390 may be formed of a frit or the like. In addition, the sealing member 390 may further include a photo-curable material. For example, the sealing member 390 may include a mixture of an organic material and a photo-curable material. The photo-curable material included in the sealing member 390 may be formed of epoxy acrylate-based resin, polyester acrylate-based resin, urethane acrylate-based resin, polybutadiene acrylate-based resin, silicone acrylate-based resin, alkyl acrylate-based resin, and the like.

The upper substrate 410 may be formed on the sealing member 390 and the pixel structure 200. Substantially, the upper substrate 410 may be formed of the same material as the lower substrate 110. For example, the upper substrate 410 may include a quartz substrate, a synthetic quartz substrate, a calcium fluoride substrate, a fluorine-doped (F-doped) quartz substrate, a soda-lime glass substrate, a non-alkali glass substrate, and the like.

After the upper substrate 410 is formed, a laser beam may be irradiated onto the sealing member 390. The sealing member 390 may be changed from a solid state to a liquid state by the irradiation of laser beam, and the sealing member 390 in the liquid state may be cured into a solid state again after a predetermined time. The upper substrate 410 may be hermetically coupled to the lower substrate 110 according to the state change of the sealing member 390. In other exemplary embodiments, after the sealing member is formed on the bottom surface of the upper substrate 410, the upper substrate 410 formed thereon with the sealing member 390 may be coupled to the lower substrate 110.

After the upper substrate 410 is hermetically coupled to the lower substrate 110, the lower substrate 110 and the upper substrate 410 positioned in the dummy area 50 may be removed along the line II-II' shown in FIG. 9. In this case, the upper substrate 410 and the lower substrate 110 may have the same size, and may be positioned to overlap each other. Alternatively, when the pad electrode 430 is formed in the dummy area 50 on the lower substrate 110, a part of the pad electrode 430 may also be removed along the line II-II' shown in FIG. 9.

Referring to FIG. 10, after the lower substrate 110 and the upper substrate 410 positioned in the dummy area 50 are removed, only the inclined surface E1 may be formed in the peripheral area 20 of the lower substrate 110.

In addition, a space 391, which is defined by the upper substrate 410, the sealing member 390, and the pad electrode 430, may be formed in the peripheral area 20. For example, since the sealing member 390 is disposed inside the inclined surface E1 and does not overlap the inclined surface E1, the space 391 may be formed by the upper substrate 410, the sealing member 390, and the pad electrode 430.

Referring to FIG. 4, the side electrode 470 may be formed on a side surface S1 of the lower substrate 110, a side surface S2 and a bottom surface B1 of the upper substrate 410, a side surface S3 of a distal end of the pad electrode 430, an upper surface U1 of a distal end of the pad electrode 430, and a side surface S4 of the sealing member 390 in the peripheral area 20. In other words, the side electrode 470 may be formed along the profile (e.g., the inner surfaces corresponding to the side surface S1 of the lower substrate 110, the side surface S2 and the bottom surface B1 of the upper substrate 410, the side surface S3 of the distal end of the pad electrode 430, the upper surface U1 of the distal end of the pad electrode 430, and the side surface S4 of the sealing member 390 in the peripheral area 20 in FIG. 4) of the space 391. For example, the side electrode 470 may be formed in the space 391, may be in direct contact with the side surface of the distal end and the upper surface of the distal end of the pad electrode 430, and may overlap the inclined surface E1. For example, the side electrode 470 may be electrically connected to the side surface of the distal end and the upper surface of the distal end of the pad electrode 430.

The side electrode 470 may be formed of a metal having a relatively high metal adhesion. For example, the side electrode 470 may include Ti, Mo, Ni, Ta, Nd, and the like. In other exemplary embodiments, the side electrode 470 may include a metal (e.g., Au, Ag, Cu, and Al) with a relatively low resistance or may include a metal or alloy (e.g., an alloy containing Ti, Mo or titanium, and an alloy containing molybdenum) with a relatively high strength.

Therefore, the organic light emitting diode display device 100 shown in FIG. 4 is manufactured according to the principles of the invention.

In the method of manufacturing the organic light emitting diode display device according to the exemplary embodiments, a groove is formed on the lower substrate 110 by using a laser, and the lower substrate 110 positioned in the dummy area 50 is removed, so that the inclined surface E1 may be easily formed on the lower substrate 110.

Figure 11:
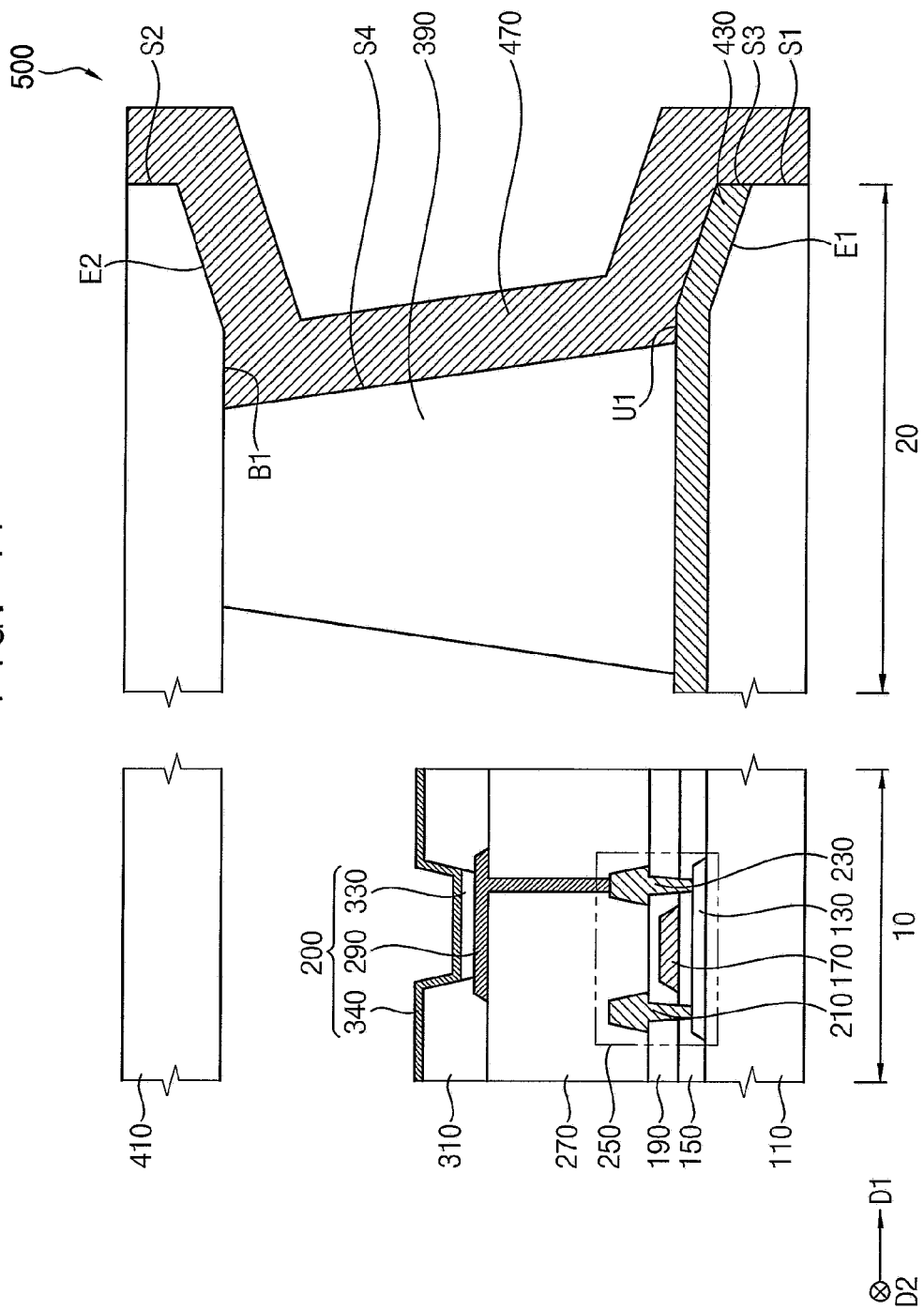
FIG. 11 is a cross-sectional view of another exemplary embodiment of an organic light emitting diode display device constructed according to the principles of the invention.

FIG. 11 is a cross-sectional view of another exemplary embodiment of an organic light emitting diode display device constructed according to the principles of the invention. The organic light emitting diode display device 500 illustrated in FIG. 11 may have substantially the same or similar configuration as the organic light emitting diode display device 100 described with reference to FIGS. 1 to 4, except for the second, upwardly inclined surface E2 formed on the upper substrate 410. In FIG. 11, duplicate descriptions for components substantially the same as or similar to the components described with reference to FIGS. 1 to 4 will be omitted to avoid redundancy.

Referring to FIGS. 1 to 3 and 11, the organic light emitting diode display device 500 may include a lower substrate 110, a semiconductor element 250, a pad electrode 430, a planarization layer 270, a pixel defining layer 310, a pixel structure 200, an upper substrate 410, a sealing member 390, a side electrode 470, and the like. The semiconductor element 250 may include the active layer 130, the gate insulating layer 150, the gate electrode 170, the insulating interlayer 190, the source electrode 210 and the drain electrode 230. The pixel structure 200 may include a lower electrode 290, a light emitting layer 330, and an upper electrode 340.

The upper substrate 410 may be disposed on the sealing member 390 and the upper electrode 340. In exemplary embodiments, the upper substrate 410 and the lower substrate 110 may have the same size and may overlap each other. In addition, the upper substrate 410 may have the second inclined surface E2 at an outer portion of the peripheral area 20. The second inclined surface E2 may face the inclined surface E1. FIG. 11 shoes an example in which the second inclined surface E2 of the upper substrate 410 is inclined toward an upper direction, and the first inclined surface E1 is inclined toward a lower direction.

The side electrode 470 may be disposed on the outermost surface of the organic light emitting diode display device 500. For example, a side surface S1 of the lower substrate 110, a side surface S2 of the upper substrate 410, a side surface S3 of the first end of the pad electrode 430, an upper surface U1 of the first end of the pad electrode 430, and a side surface S4 of the sealing member 390 may be defined as the outermost surface of the organic light emitting diode display device 500, and the side electrode 470 may be in contact with the outermost surface of the organic light emitting diode display device 500. For example, the outermost surface of the organic light emitting diode display device 500 may correspond to an inner surface of a space defined by the upper substrate 410, the sealing member 390, and the pad electrode 430 in the peripheral area 20. The sealing member 390 may be disposed inside the inclined surface E1 and the inclined surface E2 and may not overlap the inclined surface E1 of the lower substrate 110 or the inclined surface E2 of the upper substrate 410. Thus, the space may be formed by the sealing member 300, the pad electrode 430 on the inclined surface E1, and the inclined surface E2. The side electrode 470 may be disposed along a profile of the space. In exemplary embodiments, the side electrode 470 may be in direct contact with the side surface of the first end of the pad electrode 430 and the upper surface of the first end, and may overlap the inclined surface E1 and the second inclined surface E2. For example, the side electrode 470 may be electrically connected to the side surface of the first end of the pad electrode 430 and the upper surface of the first end of the pad electrode 430. For example, the side electrode 470 may partially fill the space such that some portion of the space is between the inclined surface E1 of the lower substrate 110 and the inclined surface E2 of the upper substrate 410. In another exemplary embodiment, the side electrode 470 may completely fill the space.

The organic light emitting diode display device 500 according to exemplary embodiments includes the lower substrate 110 with the inclined surface E1 and the upper substrate 410 with the second inclined surface E2. Thus, when the flexible circuit board is disposed on the side electrode 470 to allow the organic light emitting diode display device 500 to be electrically connected to the external device 101, the contact area between the flexible circuit board and the side electrode 470 is increased, so that the adhesion characteristics of the flexible circuit board and the side electrode 470 may be more improved.

The exemplary embodiments may be applied to various types of display devices including an organic light emitting diode display device. The exemplary display devices may have various applications, including a vehicle-display device, a ship-display device, an aircraft-display device, portable communication devices, display devices for display or for information transfer, a medical-display device, etc.

Although certain exemplary embodiments and implementations have been described herein, other exemplary embodiments and modifications will be apparent from this description. Accordingly, the inventive concepts are not limited to such exemplary embodiments, but rather to the broader scope of the appended claims and various obvious modifications and equivalent arrangements as would be apparent to a person of ordinary skill in the art.

What is claimed is:

1. A display device comprising:
a first substrate having a display area and a peripheral area, the first substrate including a first inclined surface disposed at an outer portion of the peripheral area and being angled relative to the first substrate in the display area;
a pixel structure disposed on the first substrate in the display area;
a second substrate disposed on the pixel structure;
a first electrode disposed on the first inclined surface and between the first substrate and the second substrate; and
a second electrode disposed on sides of the first and second substrates, the second electrode being in contact with the first electrode,
wherein the first electrode overlaps the first inclined surface of the first substrate.

2. The display device of claim 1, wherein the second electrode overlaps the first inclined surface of the first substrate.

3. The display device of claim 1, wherein:
the first substrate and the second substrate comprise lower and upper substrates, respectively, and have substantially the same size, and
the sides of the lower and upper substrates are substantially aligned.

4. The display device of claim 1, wherein the first electrode comprises a pad electrode extending from the first inclined surface of the first substrate in a direction from the peripheral area to the display area, and is electrically connected to the pixel structure.

5. The display device of claim 1, further comprising a sealing member disposed in the peripheral area between the first substrate and the second substrate.

6. The display device of claim 5, wherein the sealing member covers a part of the first electrode.

7. The display device of claim 5, wherein the sealing member does not overlap the first inclined surface of the first substrate.

8. The display device of claim 5, wherein the second electrode comprises a side electrode and the sealing member and the side electrode are in contact with each other.

9. The display device of claim 5, wherein the first electrode comprises a pad electrode, and the second electrode comprises a side electrode disposed in a space in the peripheral area defined by the second substrate, the sealing member, and the pad electrode.

10. The display device of claim 1, wherein the second substrate includes a second inclined surface being angled relative to the second substrate in the display area and opposed to the first inclined surface.

11. The display device of claim 10, wherein:
the display device is an organic light emitting diode display device,
the first inclined surface is inclined in one of an upward or downward direction,
the second inclined surface is inclined in the other of the upward or downward direction, and
the second electrode overlaps the second inclined surface.

12. A method of manufacturing a display device, the method comprising the steps of:
providing a first substrate having a display area, a peripheral area, and a dummy area;
forming a groove in a first portion of the first substrate overlapping the peripheral area and the dummy area;
forming a first electrode on the first substrate to overlap the groove in the peripheral area;
forming a pixel structure on the first substrate in the display area;
forming an inclined surface of the first substrate in the peripheral area by removing the first substrate in the dummy area; and
forming a second electrode in contact with the first electrode.

13. The method of claim 12, further comprising the steps of:
forming a sealing member on the first substrate in the peripheral area;
forming a second substrate on the pixel structure and the sealing member; and
coupling the first substrate to the second substrate through the sealing member.

14. The method of claim 13, wherein the first electrode comprises a pad electrode, and the second electrode comprises a side electrode being in contact with the second substrate, the first substrate, the pad electrode, and the sealing member.

15. The method of claim 13, wherein:
the first electrode extends from the inclined surface of the first substrate in a direction from the peripheral area to the display area, and
the sealing member covers at least a part of the first electrode.

16. The method of claim 13, wherein, after the first substrate in the dummy area is removed, the first substrate and the second substrate have substantially the same size, and sides of the second substrate and the first substrate are substantially aligned.

17. The method of claim 13, wherein the second electrode is formed in a space in the peripheral area defined by the second substrate, the sealing member, and the first electrode.

18. The method of claim 13, wherein the sealing member does not overlap the inclined surface of the first substrate.

19. The method of claim 13, wherein the display device is an organic light emitting diode display device and further comprising the steps of:
forming a semiconductor element in the display area between the first substrate and the pixel structure, wherein
the step of forming of the semiconductor element comprises:
forming an active layer on the first substrate;
forming a gate insulating layer on the active layer;
forming a gate electrode on the gate insulating layer;
forming an insulating interlayer on the gate electrode; and
forming source and drain electrodes on the insulating interlayer.

20. The method of claim 19, wherein the first electrode and the source and drain electrodes are simultaneously formed from the same material.

* * * * *